(12) United States Patent
Wang et al.

(10) Patent No.: US 7,781,269 B2
(45) Date of Patent: Aug. 24, 2010

(54) TRIANGLE TWO DIMENSIONAL COMPLEMENTARY PATTERNING OF PILLARS

(75) Inventors: Chun-Ming Wang, Fremont, CA (US); Yung-Tin Chen, Santa Clara, CA (US); Roy E. Scheuerlein, Cupertino, CA (US)

(73) Assignee: Sandisk 3D LLC, Milpitas, CA (US)

( * ) Notice: Subject to any disclaimer, the term of this patent is extended or adjusted under 35 U.S.C. 154(b) by 52 days.

(21) Appl. No.: 12/216,109

(22) Filed: Jun. 30, 2008

(65) Prior Publication Data
US 2009/0321789 A1 Dec. 31, 2009

(51) Int. Cl.
*H01L 21/82* (2006.01)
(52) U.S. Cl. .................. 438/129; 438/39; 257/202; 257/E45.002
(58) Field of Classification Search .......... 257/E21.421, 257/E21.455, E21.623, E21.637, 202; 438/39, 438/128
See application file for complete search history.

(56) References Cited

U.S. PATENT DOCUMENTS

| | | | |
|---|---|---|---|
| 4,151,602 A | 4/1979 | Haisma et al. | |
| 4,646,266 A | 2/1987 | Ovshinsky et al. | |
| 5,024,971 A | 6/1991 | Baker et al. | |
| 5,482,885 A | 1/1996 | Lur et al. | |
| 5,739,068 A | 4/1998 | Jost et al. | |
| 5,751,012 A | 5/1998 | Wolstenholme et al. | |
| 5,835,396 A | 11/1998 | Zhang | |
| 5,915,167 A | 6/1999 | Leedy | |
| 5,977,638 A | 11/1999 | Rodgers et al. | |
| 5,998,287 A | 12/1999 | Huang | |
| 6,034,882 A | 3/2000 | Johnson et al. | |

(Continued)

FOREIGN PATENT DOCUMENTS

EP   0 288 739 A2   11/1988

(Continued)

OTHER PUBLICATIONS

U.S. Appl. No. 09/560,626, filed Apr. 22, 2000, Knall.

(Continued)

*Primary Examiner*—Thanh V Pham
*Assistant Examiner*—Mark A Laurenzi, III
(74) *Attorney, Agent, or Firm*—The Marbury Law Group, PLLC (57) ABSTRACT

A method of making a semiconductor device includes forming at least one device layer over a substrate, forming a plurality of spaced apart first features over the device layer, where each three adjacent first features form an equilateral triangle, forming sidewall spacers on the first features, filling a space between the sidewall spacers with a plurality of filler features, selectively removing the sidewall spacers, and etching the at least one device layer using at least the plurality of filler features as a mask. A device contains a plurality of bottom electrodes located over a substrate, a plurality of spaced apart pillars over the plurality of bottom electrodes, and a plurality of upper electrodes contacting the plurality of pillars. Each three adjacent pillars form an equilateral triangle, and each pillar comprises a semiconductor device. The plurality of pillars include a plurality of first pillars having a first shape and a plurality of second pillars having a second shape different from the first shape.

21 Claims, 11 Drawing Sheets

U.S. PATENT DOCUMENTS

| | | | |
|---|---|---|---|
| 6,055,180 | A | 4/2000 | Gudesen et al. |
| 6,096,659 | A | 8/2000 | Gardner et al. |
| 6,185,122 | B1 | 2/2001 | Johnson et al. |
| 6,420,215 | B1 | 7/2002 | Knall et al. |
| 6,420,231 | B1 | 7/2002 | Harari et al. |
| 6,496,401 | B2 | 12/2002 | Weis |
| 6,618,295 | B2 | 9/2003 | Scheuerlein |
| 6,631,085 | B2 | 10/2003 | Kleveland et al. |
| 6,855,614 | B2 | 2/2005 | Metzler |
| 6,856,572 | B2 | 2/2005 | Scheuerlein et al. |
| 6,879,505 | B2 | 4/2005 | Scheuerlein |
| 6,951,780 | B1 * | 10/2005 | Herner .................. 438/128 |
| 6,952,030 | B2 | 10/2005 | Herner et al. |
| 7,081,377 | B2 | 7/2006 | Cleeves |
| 7,176,064 | B2 | 2/2007 | Herner |
| 7,177,169 | B2 | 2/2007 | Scheuerlein |
| 7,211,866 | B2 | 5/2007 | Yuan et al |
| 7,271,057 | B2 | 9/2007 | Eppich |
| 7,307,013 | B2 | 12/2007 | Raghuram et al. |
| 2002/0052068 | A1 | 5/2002 | Juengling |
| 2002/0072208 | A1 | 6/2002 | Gonzalez et al. |
| 2003/0122156 | A1 | 7/2003 | Maimon |
| 2003/0157436 | A1 | 8/2003 | Manger et al. |
| 2003/0178684 | A1 | 9/2003 | Nakamura |
| 2004/0241993 | A1 | 12/2004 | Lin |
| 2004/0245557 | A1 | 12/2004 | Seo et al. |
| 2005/0052915 | A1 | 3/2005 | Herner et al. |
| 2005/0112812 | A1 | 5/2005 | Jang |
| 2005/0226067 | A1 | 10/2005 | Herner et al. |
| 2005/0269553 | A1 | 12/2005 | Sen et al. |
| 2006/0177977 | A1 | 8/2006 | Chan et al. |
| 2006/0216937 | A1 | 9/2006 | Dunton et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0049035 | A1 | 3/2007 | Tran |
| 2007/0059914 | A1 | 3/2007 | Jung et al. |
| 2007/0099431 | A1 | 5/2007 | Li |
| 2007/0114508 | A1 | 5/2007 | Herner et al. |
| 2007/0114509 | A1 | 5/2007 | Herner |
| 2007/0158688 | A1 | 7/2007 | Caspary et al. |
| 2007/0176160 | A1 | 8/2007 | Uchiyama et al. |
| 2007/0197014 | A1 | 8/2007 | Jeon et al. |
| 2007/0284656 | A1 | 12/2007 | Radigan et al. |
| 2008/0014533 | A1 | 1/2008 | Keller et al. |
| 2008/0085600 | A1 | 4/2008 | Furukawa et al. |
| 2008/0128867 | A1 | 6/2008 | Lee |
| 2009/0149026 | A1 | 6/2009 | Zhou et al. |

FOREIGN PATENT DOCUMENTS

| | | |
|---|---|---|
| EP | 1 746 645 A2 | 1/2007 |
| EP | 1 818 977 A2 | 8/2007 |
| WO | WO 2004/061851 A2 | 7/2004 |
| WO | WO 2007/103343 A1 | 9/2007 |

OTHER PUBLICATIONS

U.S. Appl. No. 09/638,428, filed Aug. 14, 2000, Johnson.
U.S. Appl. No. 11/864,205, filed Sep. 28, 2007, T. Chen et al.
U.S. Appl. No. 12/000,758, filed Dec. 17, 2007, Christopher J. Petti et al.
U.S. Appl. No. 12/005,276, filed Dec. 27, 2007, Roy E. Scheuerlein et al.
U.S. Appl. No. 12/005,346, filed Dec. 27, 2007, Roy E. Scheuerlein et al.
U.S. Appl. No. 12/149,151, filed Apr. 28, 2008, Yung-Tin Chen et al.
Naji, Peter J. et al., "A 256kb 3.0V 1T1MTJ Nonvolatile Magnetoresitive RAM", Digest of of Technical Papers of the 2001 IEEE International Solid-State Circuits Conference, ISSCC 2001 / Session 7 / Technology Directions: Advanced Technologies / 7.6, Feb. 6, 2001, 3 pgs.
Black et al., Polymer Self Assembly in Semiconductor Microelectronics, IBM J. Res. & Dev., Sep. 2007, pp. 605-633, vol. 51, No. 5.
Office Action mailed Jul. 22, 2009 received in U.S. Appl. No. 12/000,758.
International Search Report and Written Opinion mailed Sep. 7, 2009 in International Application No. PCT/US2009/002400.
International Search Report and Written Opinion mailed Oct. 9, 2009 in International Application No. PCT/US2009/048581.
Invitation to Pay Additional Fees including partial International Search Report mailed Oct. 21, 2009 in International Application No. PCT/US2009/048584.
Office Action mailed Jul. 28, 2009 received in U.S. Appl. No. 12/149,151.
International Search Report and Written Opinion mailed Mar. 4, 2010, received in International Application No. PCT/US2009/059188.
Office Action mailed Jan. 14, 2010, received in U.S. Appl. No. 12/000,758.
Office Action mailed Jan. 15, 2010, received in U.S. Appl. No. 12/149,151.

* cited by examiner

Figure 11c

TRIANGLE TWO DIMENSIONAL COMPLEMENTARY PATTERNING OF PILLARS

BACKGROUND

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is a primary motivation in the designing of such circuits.

As the dimensions for structures formed on a semiconductor wafer diminish, tools currently available to create these devices reach their limits. By way of example, currently available 193 nanometer immersion tools will fail to create structures with a pitch of less than about 80 nm. To fabricate first features smaller than this with the currently available tools, one must use more complicated processes. One such process is the technique of double exposure/double patterning. Another is the use of sidewall spacers, formed on a template pattern which is then removed. The sidewall spacers are then used as mask during etching of the underlying film or films.

For simple, one-dimensional, regular line-and-space patterns, both of these techniques have the effect of dividing the photolithographically-produced pitch by two. In this way, the resolution capability of a given photolithography tool can be extended.

However, for a two-dimensional pattern of regularly-spaced pillars, the double-patterning scheme extends the pitch by a factor of the square root of 2. The sidewall spacer method, as-is, cannot be used at all since such a scheme would produce regularly spaced cylindrical annuli, rather than solid pillars.

SUMMARY

One embodiment provides a method of making a semiconductor device that includes forming at least one device layer over a substrate, forming a plurality of spaced apart first features over the device layer, where each three adjacent first features form an equilateral triangle, forming sidewall spacers on the first features, filling a space between the sidewall spacers with a plurality of filler features, selectively removing the sidewall spacers, and etching the at least one device layer using at least the plurality of filler features as a mask.

Another embodiment provides method of making a pillar-shaped nonvolatile memory device array that includes forming a plurality of bottom electrodes over a substrate, forming at least one semiconductor device layer over the plurality of bottom electrodes, forming a plurality of spaced apart first features over the at least one semiconductor device layer, where each three adjacent first features form an equilateral triangle, forming sidewall spacers on the plurality of spaced apart first features, forming a filler film over and between the plurality of spaced apart first features, planarizing the filler film to expose upper portions of the plurality of spaced apart first features and upper portions of the sidewall spacers to leave a plurality of filler features located between the sidewall spacers, selectively removing the sidewall spacers, etching the at least one semiconductor device layer to form a plurality of pillar-shaped diode containing nonvolatile memory cells using at least the plurality of filler features as a mask, and forming a plurality of upper electrodes contacting the plurality of nonvolatile memory cells.

Another embodiment provides a device containing a plurality of bottom electrodes located over a substrate, a plurality of spaced apart pillars over the plurality of bottom electrodes, and a plurality of upper electrodes contacting the plurality of pillars. Each three adjacent pillars form an equilateral triangle, and each pillar comprises a semiconductor device. The plurality of pillars include a plurality of first pillars having a first shape and a plurality of second pillars having a second shape different from the first shape.

BRIEF DESCRIPTION OF THE DRAWINGS

FIGS. 5 through 10 are cross-sectional side views (Figures with subpart a), and top views (Figures with subpart b) of the device layers according to the first embodiment, and top views (Figures with subpart c) of the device layers according to the second embodiment, in a process of making a device array.

DETAILED DESCRIPTION OF THE EMBODIMENTS

The present inventors realized that instead of using sidewall spacers as mask for etching device layers, the sidewall spacers may instead be used as sacrificial spacers when forming the etching mask. Once the etching mask is formed, the sidewall spacers are removed and portions of the device layers located below the former sidewall spacer locations are removed to leave spaced apart devices, such as pillar shaped devices.

For example, one or more device layers are first formed over a substrate. Any suitable substrate may be used, such as a semiconductor wafer (including silicon or compound semiconductor wafers) or a metal, glass, ceramic or plastic substrate. The substrate may be covered by one or more insulating layers and/or one or more devices, such as driver circuits, may be formed on or in the substrate. The device layers may comprise semiconductor layers for semiconductor devices, electrically conductive layer or layers which form electrodes, and/or insulating layers for isolation of the semiconductor or conductive portions of the devices.

A plurality (i.e., more than two) spaced apart first features are formed over the device layers. The first features may be formed directly on or above semiconductor, conductive and/or insulating device layers. The first features may have any shape and may be made of any material as long as these first features can subsequently function as an etching mask for etching the underlying device layers.

For example, as will be described in more detail below, the first features may have a cylindrical shape. However, other shapes, such as rectangular or triangular shape may also be used if rectangular or triangular devices are to be formed. The first features may have any desired size, and preferably have the same width as the desired width of the underlying devices. The first features should have a sufficient height or thickness to act as an etching mask. The first features may comprise an electrically conductive material, such as tungsten, and may optionally be covered by a silicon nitride, titanium nitride or other hard mask material. Other materials may also be used. Alternatively, the first features may comprise an insulating material, such as silicon oxide, amorphous carbon or silicon nitride, or a semiconductor material, such as polysilicon or amorphous silicon.

Sidewall spacers are then formed on the first features. Sidewall spacers may be formed by conventional sidewall spacer formation methods, such as by depositing a film over the first features and then anisotropically etching the film to leave sidewall spacers on the first features. The spacers may be made of a conductive, insulating or semiconductor material different from that of the upper portions of the first features. The sidewall spacer material can be selected i) such that it can be selectively anisotropically etched with dry etch chemistry compared to the material in at least the upper portions of the first features; and ii) such that it can be selectively removed (such as isotropically etched) compared to the material in at least the upper portions of the first features using a different dry or wet etch chemistry. For example, when the first features comprise tungsten and a nitride hard mask, the spacers may be formed from silicon oxide. When the first features comprise silicon oxide, the spacers may be formed from a nitride, such as silicon nitride. Other material combinations may also be used as long as the temperature of depositing the spacers will not deform the first features.

Subsequently, the spaces between adjacent spacers located on adjacent first features are filled with so-called filler features. The filler features may be formed by forming a filler film or layer over and between the first features and the sidewall spacers, followed by planarizing the filler film to expose upper portions of the first features and upper portions of the sidewall spacers. The planarization can be carried out by chemical-mechanical polishing (CMP) or etchback. The CMP process can use the upper portions of the first features or spacers as a polish stop. For example, a TiN hard mask on the first features may be used as a polish stop. The filler film may comprise the same material as the first features or it may comprise a material having similar etching characteristics as the first features. The filler film material should be different from the material of the sidewall spacers so that the sidewall spacers can be selectively etched compared to the first features and the filler features. For example, the filler film material may comprise tungsten when the first features are also made of tungsten. Alternatively, the filler film material may comprise silicon oxide when the first features are made of silicon oxide.

In one embodiment, after the filler features are formed, the sidewall spacers are selectively removed. The removal may be performed by selective wet etching for example. The step of selectively removing comprises selectively etching the material of the sidewall spacers without substantially removing the original feature or filler feature material. The removal of the spacers leaves first features and the filler features spaced apart from each other. In an alternative embodiment, after the step of forming sidewall spacers, the first features are selectively removed, leaving the spacers spaced apart from one another. A filler material film or layer is then formed between the spacers, filling the space initially occupied by the first features and the spaces. At this point in the fabrication of the device array, the full surface are completely filled with either spacers or filler features. The spacers are then selectively etched away leaving the filler features spaced apart. The filler features may comprise first filler features having a first shape defined by the first features, and second filler features having a second shape defined by the interstitial spaces located between the sidewall spacers. The plurality of filler features can then be used as a mask to etch the at least one device layer, using methods described above.

The spaced apart first features and filler features (in some embodiments), or first and second filler features (in alternative embodiments) then function as an etching mask during the etching of the underlying device layers. The device layers may be etched using isotropic or anisotropic etching using the first features and the filler features as a mask. The first features and/or filler features may be retained in a completed device or removed after etching the device layers. For example, the conductive first features and filler features may be retained as portions of upper electrodes.

Any suitable devices may be formed. The devices may have a substantially cylindrical and/or substantially rectangular pillar shape, depending on the shape of the first features and the filler features, as will be described in more detail below. Non-pillar shaped devices may also be formed. The devices may comprise diodes, transistors, resistors, antifuse dielectrics, fuses, resistivity-switching materials, capacitors, etc. Logic, volatile memory or nonvolatile memory devices or arrays may be formed.

Figure 1:
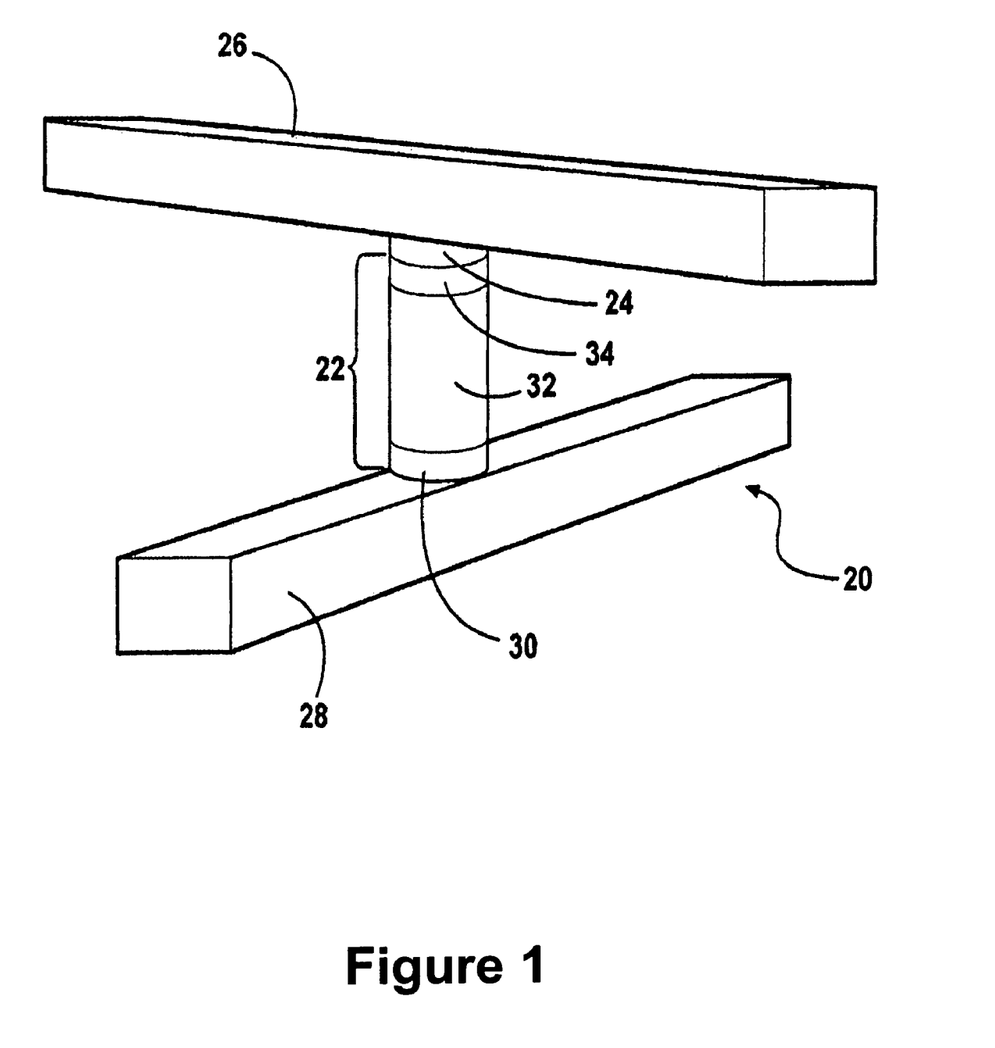
FIG. 1 is a perspective view of a nonvolatile memory cell.

In a preferred non-limiting embodiment, a plurality of pillar shaped devices which comprise a plurality of diode containing nonvolatile memory cells are formed. Referring to FIG. 1, U.S. Pat. No. 6,952,030, issued to Herner et al. and entitled "High-Density Three-Dimensional Memory Cell," hereinafter the "'030 patent" and hereby incorporated by reference, discloses an exemplary nonvolatile memory cell which can be formed by the method of the embodiments of the present invention.

The memory cell 20 includes a vertically oriented, cylindrical pillar shaped junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material. Another suitable diode comprises a tunnel diode with a metal insulator metal structure (MIM diode) or a MIIM diode comprising a metal layer, a first insulator, a second insulator, and a second metal layer (where the first and second insulators may be different from each other). In general, any non-linear conductance device can be used.

The diode 22 and an optional antifuse dielectric 24 are interposed between top 26 and bottom 28 conductors or electrodes. The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the antifuse dielectric 24 are arranged in series between the bottom conductor 28 and the top conductor 26, which may be formed of a metal, such as tungsten and/or TiN. The antifuse dielectric 24 may be located above or below the diode 22.

The memory cell may comprise a one-time programmable (OTP) or re-writable nonvolatile memory cell, and may be selected from at least one of antifuse, fuse, diode and antifuse arranged in a series, polysilicon memory effect cell, metal oxide memory, switchable complex metal oxide, carbon nanotube memory, graphene or other carbon switchable resistance material, phase change material memory, conductive bridge element, or switchable polymer memory. For example, each diode 22 may act as a steering element of a memory cell and another material or layer 24 which acts as a resistivity switching material (i.e., which stores the data) is provided in series with the diode between the conductors. The resistivity of the resistivity switching material 24 may be increased or decreased in response to a forward and/or reverse bias provided between the electrodes or conductors.

Briefly, the cell 20 operates as follows. In the initial state, very little current flows through the junction diode 22 when a read voltage is applied between the top conductor 26 and the bottom conductor 28 because the antifuse dielectric 24 impedes current flow. The application of a programming voltage between the top conductor 26 and bottom conductor 28 causes dielectric breakdown of the antifuse material, permanently forming a conductive path through the antifuse 24. If the diode semiconductor material is initially formed in a high resistivity state, then the semiconductor material of diode 22 may be altered as well, changing it to a lower-resistivity state. After programming, a higher read current flows between the top conductor 26 and the bottom conductor 28 upon application of a read voltage. In this way, a programmed cell can be distinguished from an unprogrammed cell.

In alternative embodiments, the antifuse dielectric 24 may be omitted. Instead, the polycrystalline semiconductor material of diode 22 is formed in a relatively high-resistivity state, which also tends to impede current flow, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage lowers the resistivity state of the diode. Thus, the diode acts as a resistivity switching material in this embodiment.

Two, three, four, or more memory levels, such as eight levels may be formed, stacked one atop the other, to form a monolithic three dimensional memory array, preferably formed above a substrate such as a monocrystalline silicon wafer, and described in the '030 patent and the '549 and '530 applications. The diode pillars 22 preferably have a pitch of less than 100 nm, such as pitch of 78 nm or less and a diameter of 100 nm or less, such as 50 nm or less, such as 32 nm for example.

The bottom electrodes or conductors 28, located underneath the device layer, can be formed either by subtractive or by Damascene methods. In a subtractive method, a conductive layer or film is patterned into spaced apart electrodes and the gaps between the electrodes are then filled with an insulating material. In a Damascene method, grooves are formed in an insulating material, a conductive layer or film is formed in the grooves and over the insulating layer, and then the conductive layer or film is planarized to leave spaced apart electrodes in the grooves.

Figure 2A:
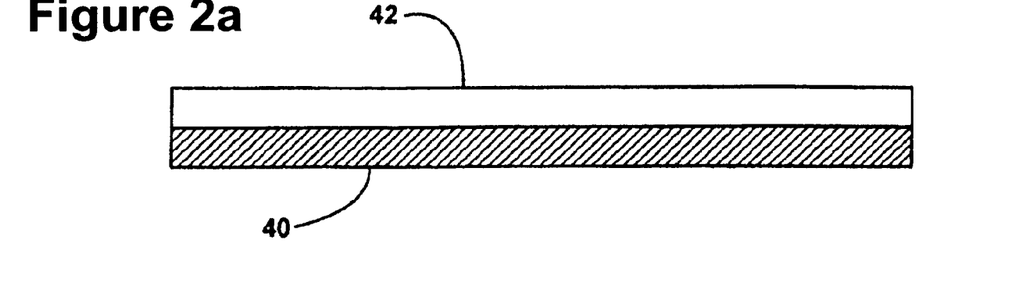
FIGS. 2a through 2d are cross-sectional side views illustrating steps in the process of forming conductive rails by a subtractive method.
Figure 2B:
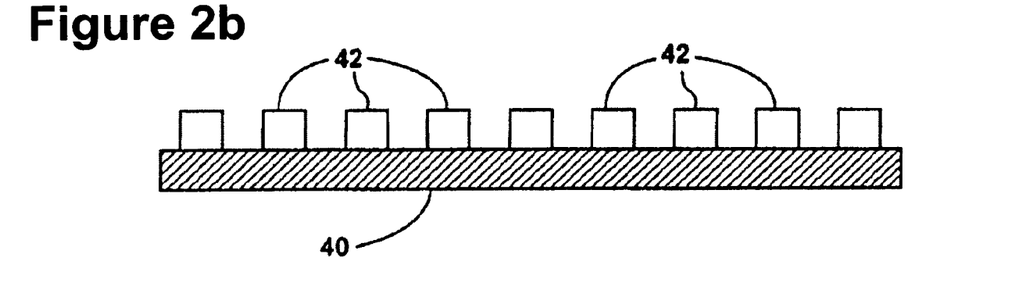
Figure 2C:
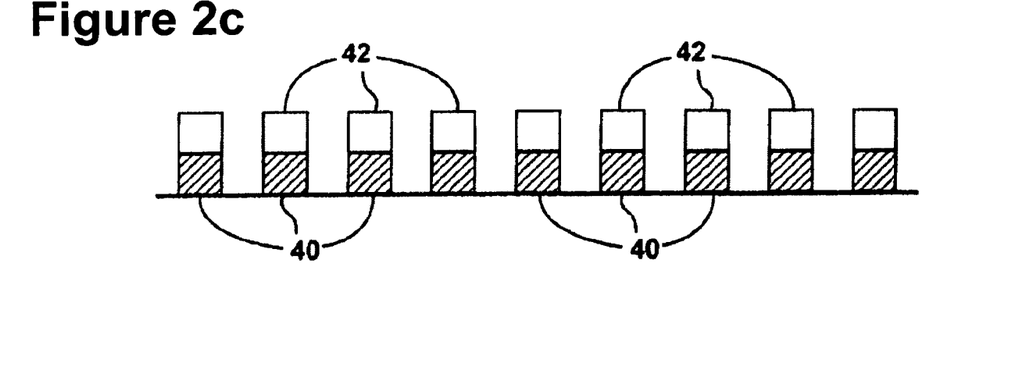
Figure 2D:
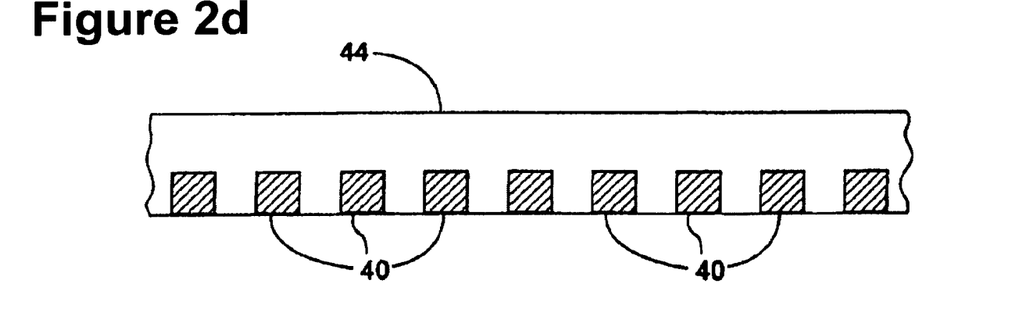

FIGS. 2a-2d illustrate the subtractive method of forming rail-shaped electrodes or conductors 28. As shown in FIG. 2a, one or more conductive layers 40, such as a W and/or a TiN layers are deposited over a substrate, and a layer of photoresist 42 is spun onto it. As shown in FIG. 2b, the layer of photoresist 42 is then photolithographically patterned into the desired form. As shown in FIG. 2c, an etch step removes portions of the conductive layer(s) 40 where they are not protected by etched photoresist layer 42. As shown in FIG. 2d, after the etch, the photoresist layer 42 is stripped, leaving conductor or electrode rails 40 behind. The gaps between the rails 40 are filled with an insulating material 44, such as silicon oxide, silicon nitride or other insulating materials. If desired, any overfill of the insulating material 44 can be removed, for example by chemical-mechanical polishing (CMP), to expose the upper surface of the rails 40 in the planarized surface of the insulating layer 44.

Figure 3A:
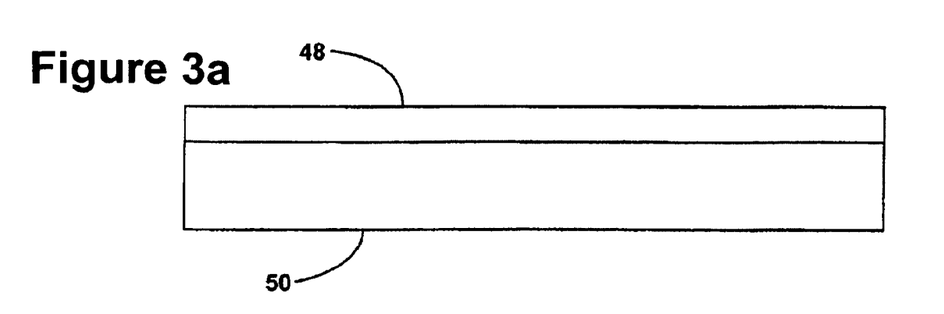
FIGS. 3a through 3d are cross-sectional side views illustrating steps in the process of forming conductive rails by a Damascene method.
Figure 3B:
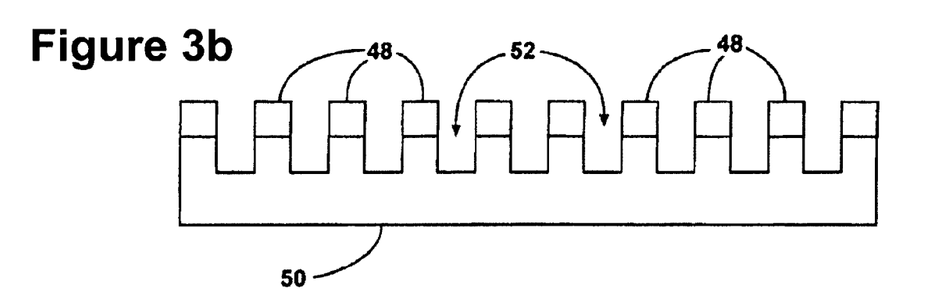
Figure 3C:
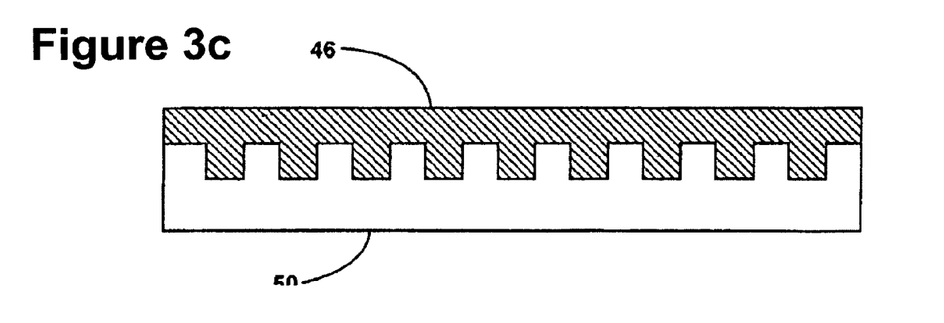
Figure 3D:
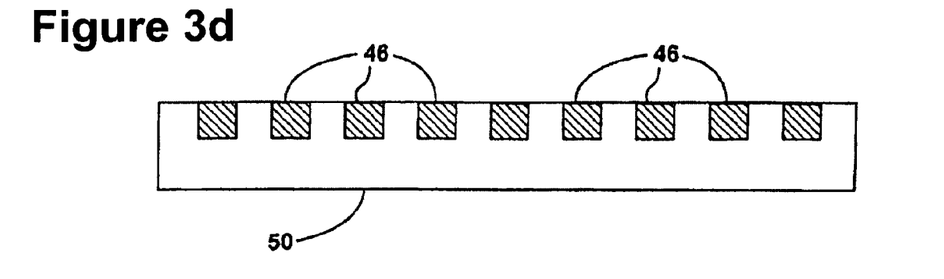

FIGS. 3a to 3d illustrate the Damascene method to form the electrode or conductor 28. First, a layer of photoresist 48 is spun onto a deposited insulating layer 50, such as a silicon oxide layer. As shown in FIG. 4b, the layer of photoresist 48 is patterned. An etch step then forms grooves or trenches 52 in the insulating layer 50. In FIG. 3c, after removal of the photoresist layer 48, one or more conductive layers 46, such as a W and/or TiN or Copper layers are deposited to fill the grooves or trenches 52. The one or more conductive layers 46 are planarized, for example by CMP or etchback, with the upper surface of the insulating layer to leave the rail shaped conductors in the grooves, as shown in FIG. 3d.

Figure 4A:
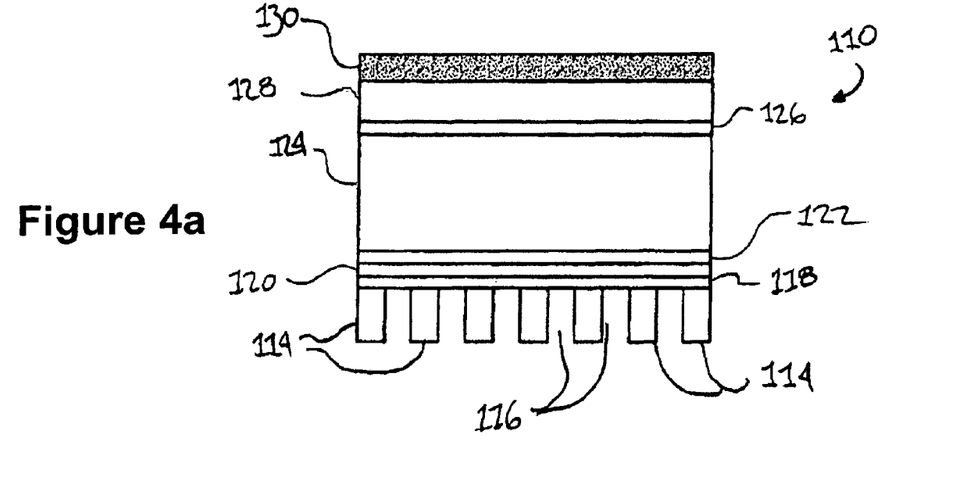
FIG. 4a is a cross-sectional side view of the device layers over bottom electrodes prior to the formation of the pillar structures.
Figure 4B:
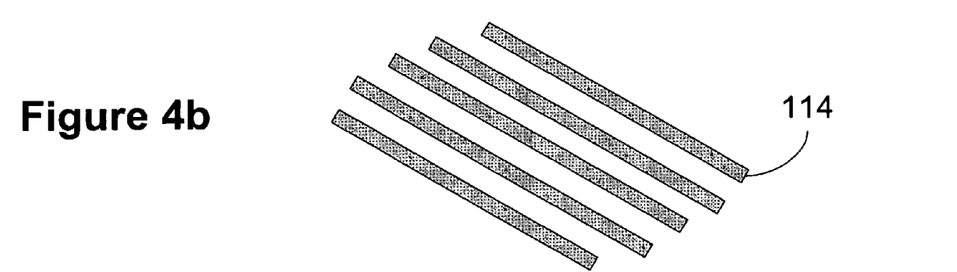
FIG. 4b is a top view of the bottom electrodes underneath the device layers according to the first embodiment.
Figure 4C:
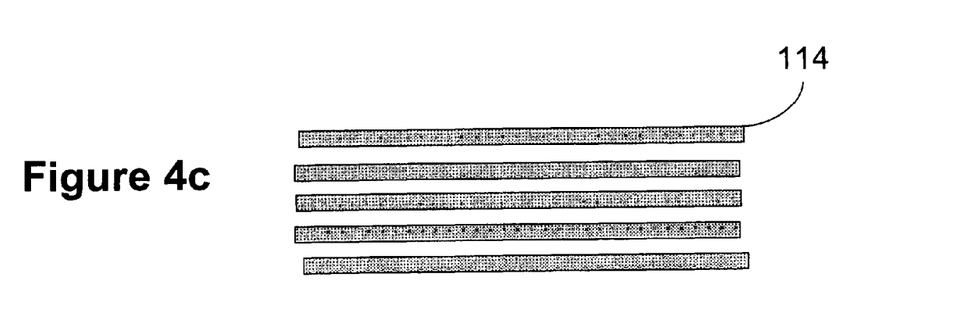
FIG. 4c is a top view of the bottom electrodes underneath the device layers according to the second embodiment.

FIG. 4a shows an initial stage of fabrication of a semiconductor device, such as a pillar shaped nonvolatile memory cell array 110, according to one embodiment of the invention. The array 110 contains a plurality of bottom electrodes 114 formed by the subtractive or Damascene methods described above with respect to FIG. 2 or 3 respectively. The electrodes 114 correspond to the rail shaped conductors 28 shown in FIG. 1. Top views of bottom electrodes underneath the device layers are illustrated in FIG. 4b (according to the first embodiment), and in FIG. 4c (according to the second embodiment). In FIG. 4b, the electrodes 114 are arranged diagonally having an angle of 30-60° with respect to horizontal direction. In FIG. 4c, the electrodes 114 are arranged horizontally. The electrodes 114 may comprise any suitable conductive material, such as tungsten, aluminum, their alloys, etc. The electrodes 114 are separated from each other by an insulating material 116, such as silicon oxide. An optional adhesion layer 118 is formed above the electrodes 114. The adhesion layer may comprise titanium nitride or tungsten nitride. The optional antifuse dielectric layer 120 is deposited over the adhesion layer 118. The antifuse dielectric layer 120 may comprise a thin silicon oxide or other insulating layer. Alternatively, another resistivity switching material described above may be substituted from the antifuse dielectric layer. Another optional adhesion layer 122, such a TiN layer, is deposited over the antifuse dielectric layer 120. Therefore, the dielectric layer 120 is sandwiched between two adhesion layers 118, 122.

One or more semiconductor layers 124, such as silicon or germanium or their alloys are formed over the adhesion layer 122. For example, the semiconductor layers 124 may comprise a lower n-type layer, a middle intrinsic layer and an upper p-type layer. The p-type layer may be formed by ion implantation of p-type dopants into the upper part of the intrinsic layer or by deposition of a p-type doped semiconductor layer on the intrinsic layer. An optional upper adhesion layer 126, such as a TiN layer, is formed over the semiconductor layers 124. A conductive layer 128, such as a W layer, is formed over the adhesion layer 126. Finally, hard mask or polish stop 130, such as a TiN or silicon nitride hard mask or polish stop layer is formed on the conductive layer 128.

Figure 5A:
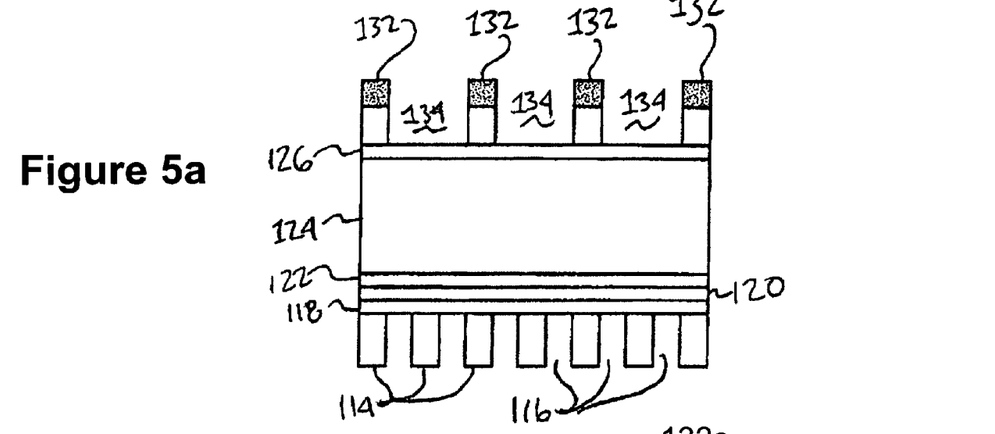
Figures 5B, 5C:
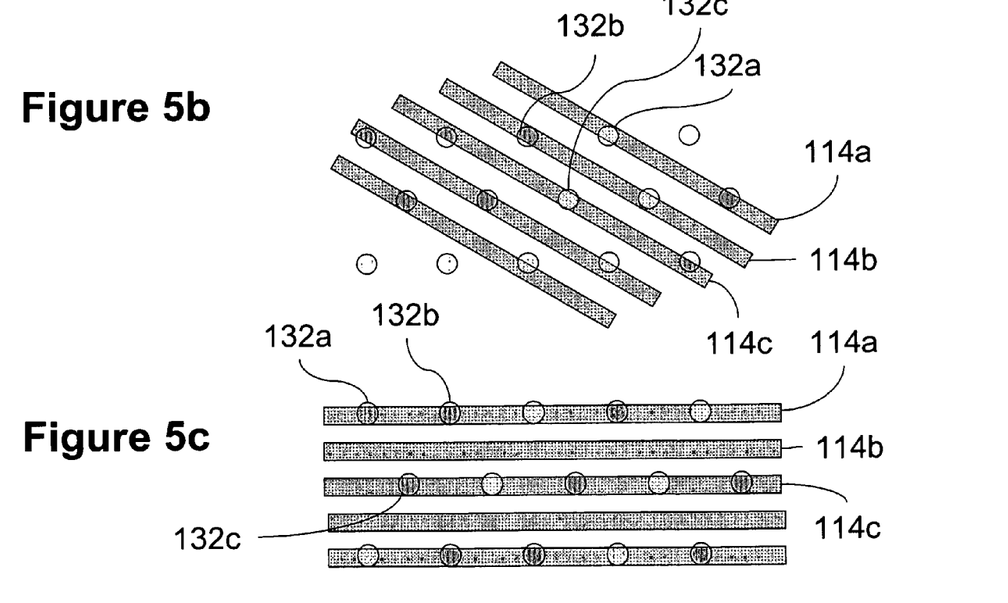

FIG. 5a represents a side cross-sectional view of the device layers over bottom electrodes and FIGS. 5b and 5c represents top views of the first features 132 over bottom electrodes 114 after the first step of processing. In the first step, a photoresist layer is formed on the hard mask 130. The photoresist layer is exposed and patterned. The photoresist pattern is then used as a mask to etch the hard mask 130 and conductive layer 128 into a plurality of first features 132. The first features 132 are spaced apart from each other by spaces 134. Each three adjacent first features 132 form an equilateral triangle.

In the first embodiment, each three adjacent first features (132a, 132b, and 132c) are formed over three adjacent bottom electrodes, and each first feature of the three adjacent first features is located over a different bottom electrode (114a, 114b, 114c). A top view of the plurality of first features 132 with respect to the position of the bottom electrodes, according to the first embodiment, is shown in FIG. 5b.

In the second embodiment, two of each three adjacent first features (132a and 132b) are formed over one first bottom electrode (114a), a third feature of said three adjacent first features (132c) is formed over a third bottom electrode (114c) such that a second bottom electrode (114b) is adjacent to and located between the first bottom electrode (114a) and the third bottom electrode (114c). A top view of the plurality of first features 132 with respect to the position of the bottom electrodes, according to the second embodiment, is shown in FIG. 5c.

Figure 6A:
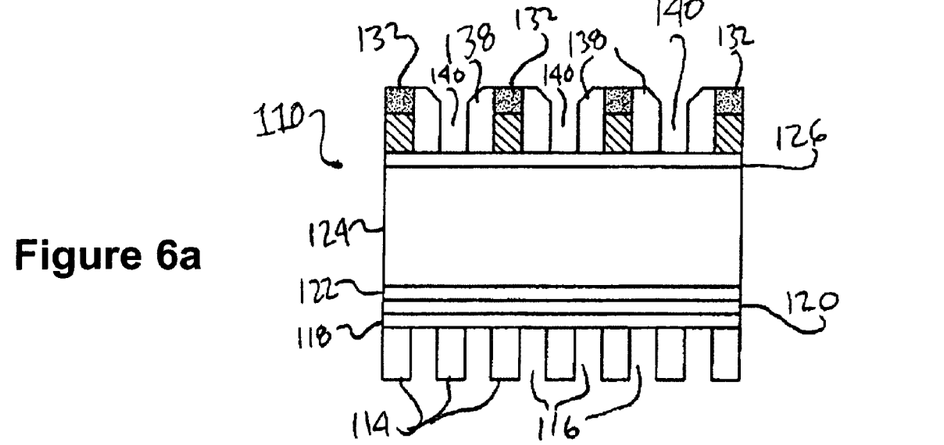
Figure 6B:
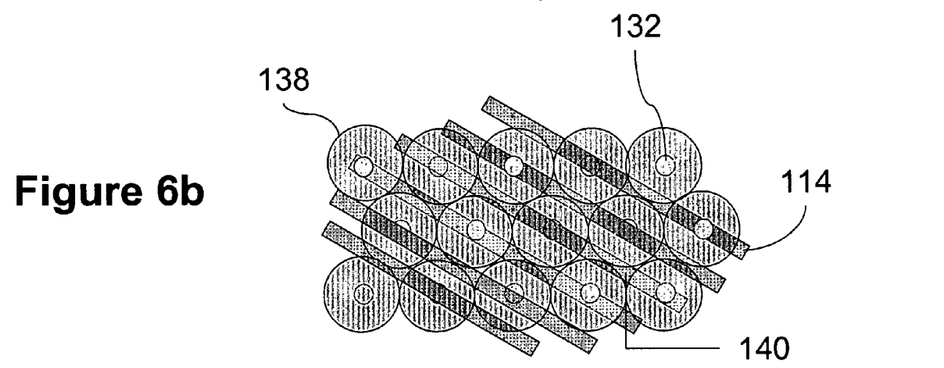
Figure 6C:
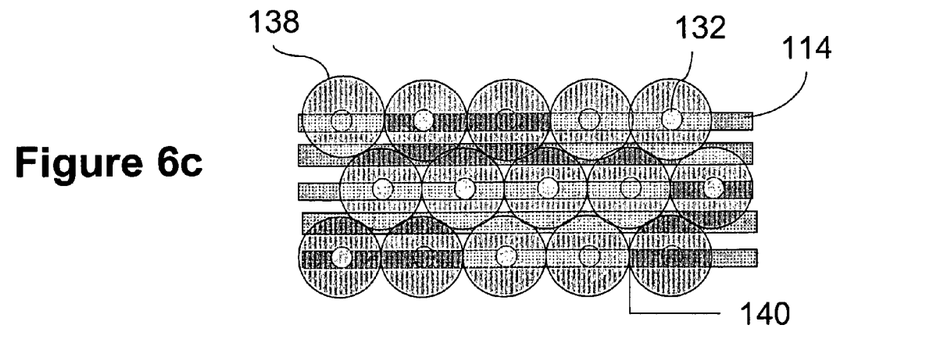

FIGS. 6a through 6c show the next process step. In this step, silicon oxide, silicon nitride or polysilicon spacers 138 are formed on each feature 132. It should be noted that if each feature 132 is cylindrical, then it technically has only one sidewall and only one ring or annulus shaped spacer 138 is formed around the sidewall of the feature 132. However, as used herein, the term "spacers" will denote the single annular spacer 138 as well as two or more spacers 138 formed on discrete sidewalls of a polygonal feature 132. The spacers 138 are formed by depositing a silicon oxide, silicon nitride or polysilicon layer or film over and between the first features 132 followed by anisotropic etching of the silicon oxide layer or film.

The oxide spacers 138 fill the spaces 134 around the first features 132, leaving discrete spaces or interstices 140 between adjacent sidewall spacers 138. As shown in FIG. 6b (top view according to the first embodiment) and FIG. 6c (top view according to the second embodiment), the sidewalls spacers 138 on adjacent first features 132 along at least two predetermined directions contact each other to form fully enclosed interstitial spaces located between the sidewall spacers.

Figure 7A:
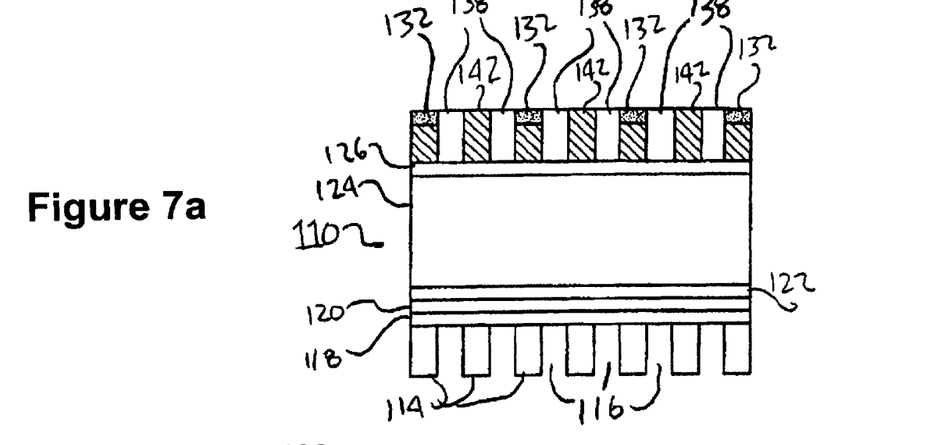
Figures 7B, 7C:
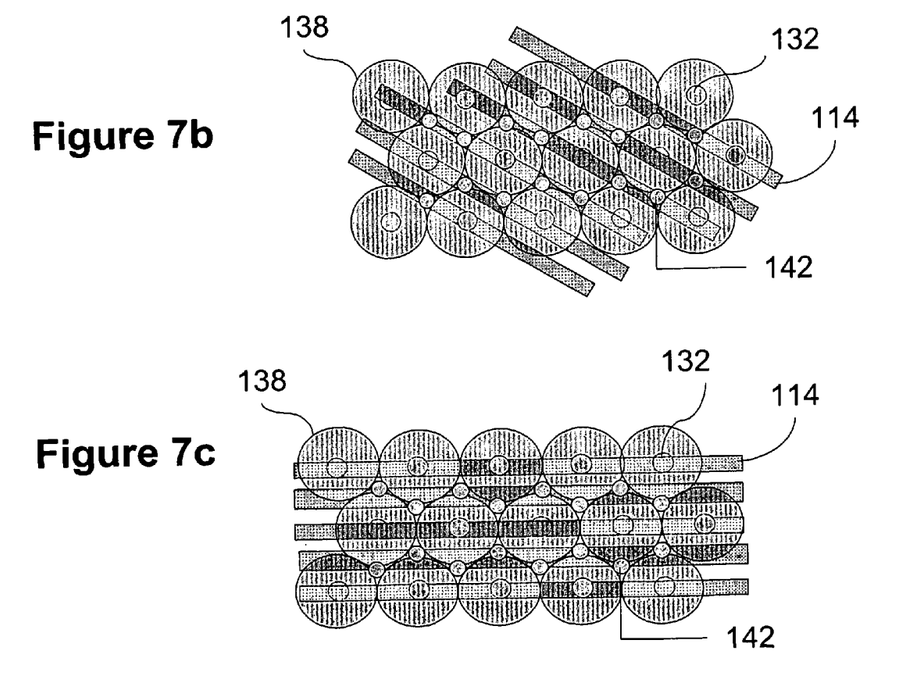

FIGS. 7a through 7c show the next two steps of the process. A tungsten filler material film or layer is formed between and over the first features 132 and spacers 138 and fills the interstitial spaces. The tungsten filler film is then planarized by CMP or etchback to expose the upper surfaces of the first features 132 (i.e., the TiN hard mask) and spacers 138. The planarization leaves a plurality of tungsten filler features 142 between the sidewall spacers 138. At this point in the fabrication of the device array, the spaces 134 shown in FIG. 5 are completely filled with either oxide spacers 138 or filler features 142.

If desired, an optional cut masking and etching step is performed after the planarization of the filler film to remove the filler film or filler features 142 from the area outside of the device array. A photoresist layer is formed over the plurality of filler features 142 and over the plurality of spaced apart first features 132. The photoresist layer is exposed such that the edges of the exposed areas intersect all of the edge first features. The remaining filler film or filler features remaining in areas outside of the device array boundary that are not covered by the photoresist pattern are etched away. If desired, the cut masking and etching step can be performed prior to the planarization step.

Figure 8A:
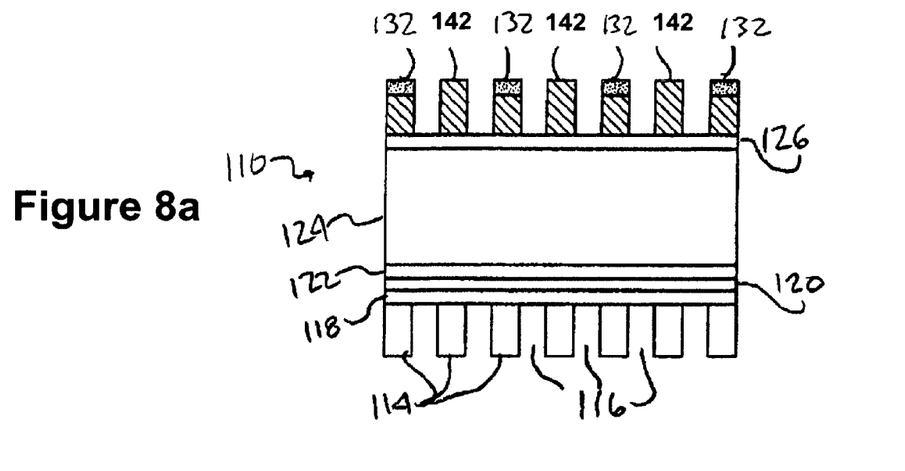
Figure 8B:
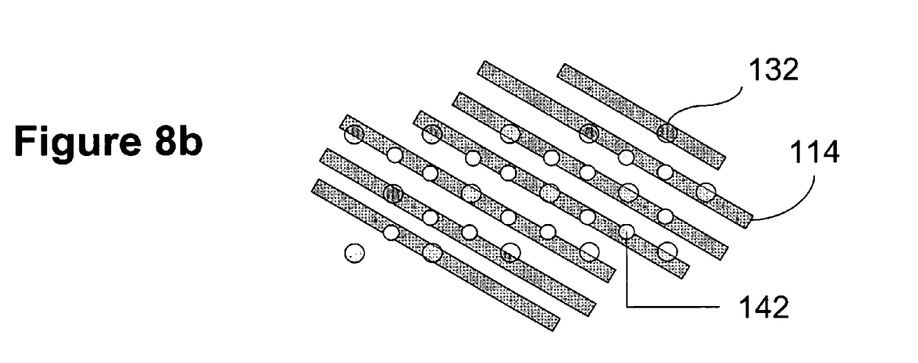
Figure 8C:
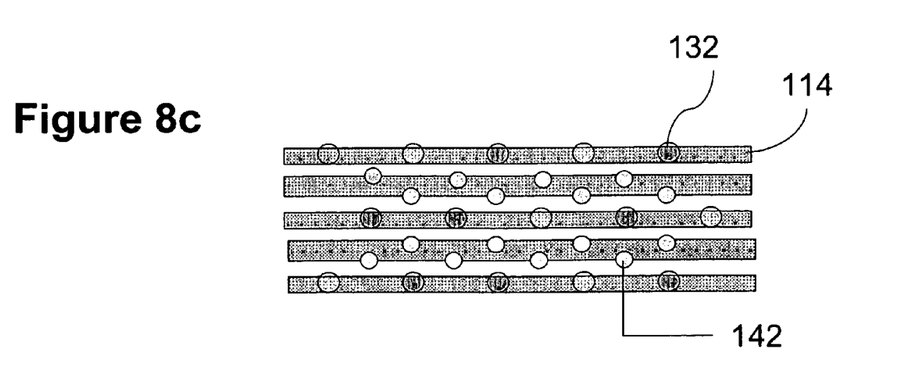

FIGS. 8a through 8c show the next step in the process. In this step, the oxide spacers 138 are selectively etched away leaving the first features 132 and filler features 142 spaced apart. The spacers 138 may be selectively etched by any selective wet or dry etch which can selectively etch silicon oxide over the TiN or silicon nitride of first features 132 and over the tungsten of filler features 142. For example, an HF isotropic wet etch may be used. As shown in FIG. 8b (top view of the first embodiment), and in FIG. 8c (top view of the second embodiment), the pitch between the first features 132 and the filler features 142 has increased compared to the pitch between the first features 132 alone due to the removal of the oxide spacers.

Figure 9A:
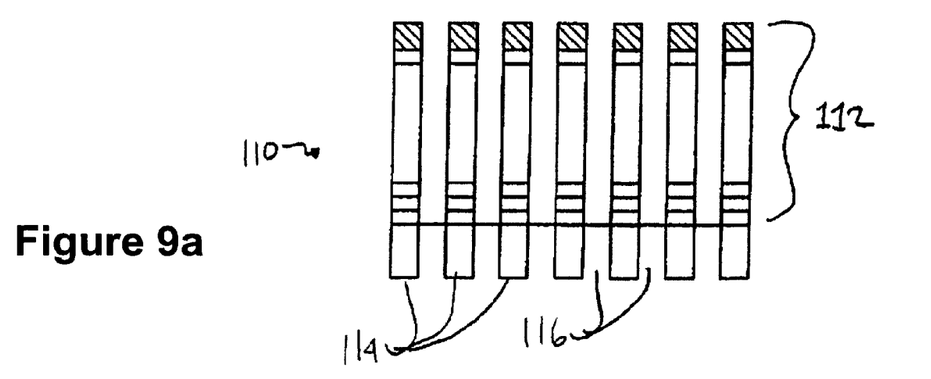
Figure 9B:
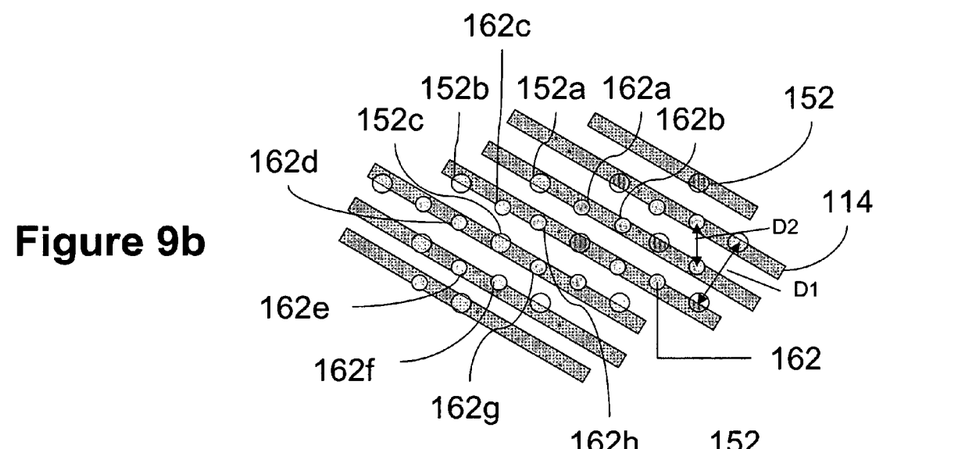
Figure 9C:
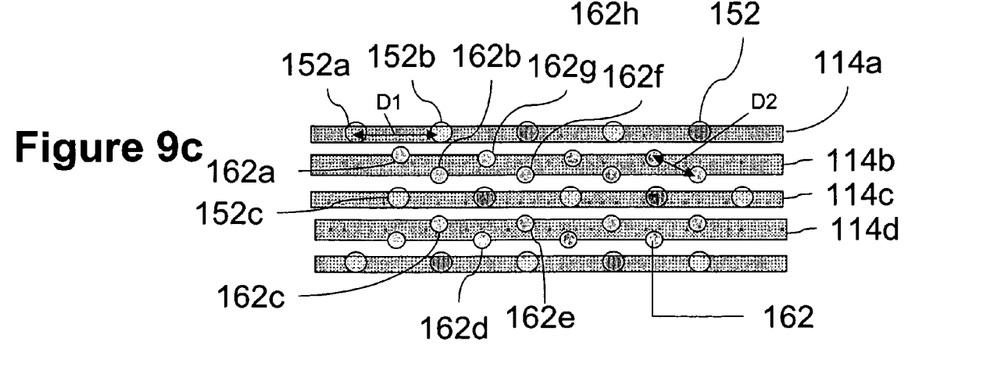

As shown in FIG. 9a, the device layers 118, 120, 122 and 124 are etched using the first features 132 and the filler features 142 as a mask to form a plurality of pillars 112. As shown in FIGS. 9b and 9c, the plurality of pillars 112 comprise a plurality of first pillars 152 having a first shape defined by the first features 132, and a plurality second pillars 162 having a second shape defined by the filler features 142. The second shape can be same or different from the first shape. In some embodiments, the first pillars 152 may have a circular cross section and the second pillars may have a cross section of a triangle with rounded corners. Each of the first pillars and second pillars can be a pillar-shaped device 112. For example, each of the devices comprises the p-i-n diode in series with an antifuse dielectric, as described with respect to FIG. 1.

In the first embodiment, as shown in FIG. 9b, a unit of three adjacent pillars comprising one first pillar 152a and two second pillars 162a, 162b repeats along a same bottom electrode 114. Three adjacent first pillars 152a, 152b, 152c form an equilateral triangle. Six second pillars 162c through 162h surround each first pillar 152c in a hexagonal configuration. Three first pillars 152a, 152b, 152c surround each second pillar 162c in an equilateral triangle configuration. A first distance, D1, between adjacent first pillars 152 is preferably larger than a second distance, D2, between adjacent second pillars 162.

In the second embodiment, as shown in FIG. 9c, the first pillars 152, such as 152a, 152b and 152c, are located over first bottom electrodes (114a or 114c) with a first distance D1 between each two adjacent first pillars 152a, 152b. The second pillars 162 are located over second bottom electrodes (114b or 114d) with a second distance D2 between each two adjacent second pillars. The second distance is preferably shorter than the first distance. The three adjacent first pillars 152a, 152b, 152c form an equilateral triangle. Six of the second pillars 162b through 162g surround each first pillar 152d in a hexagonal configuration. Three of the first type pillars 152a, 152b, 152c surround each second pillar 162a in a equilateral triangle configuration.

The spaces between the pillar devices 112 are filled with a gap fill insulating material, such as silicon oxide, to isolate the devices 112 from each other. The gap fill insulating material may be planarized by CMP or etchback.

Figure 10A:
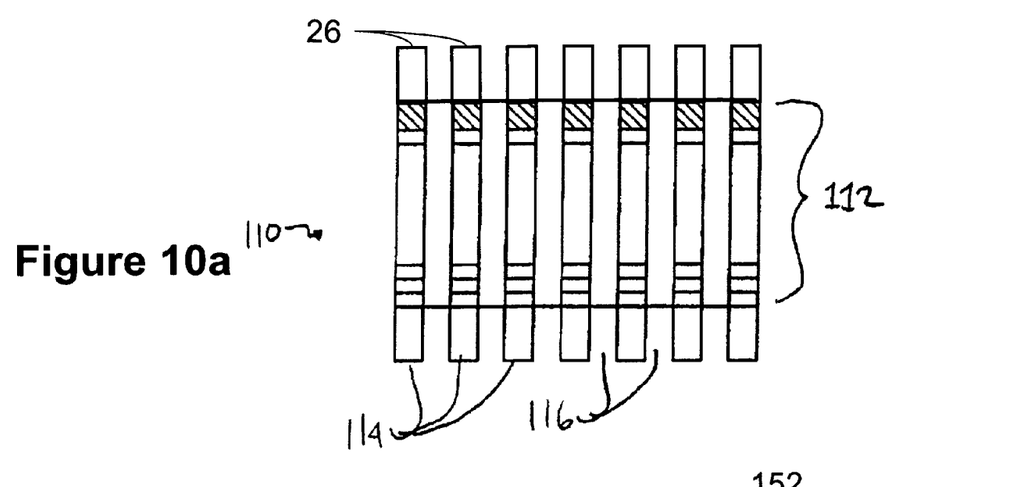
Figure 10B:
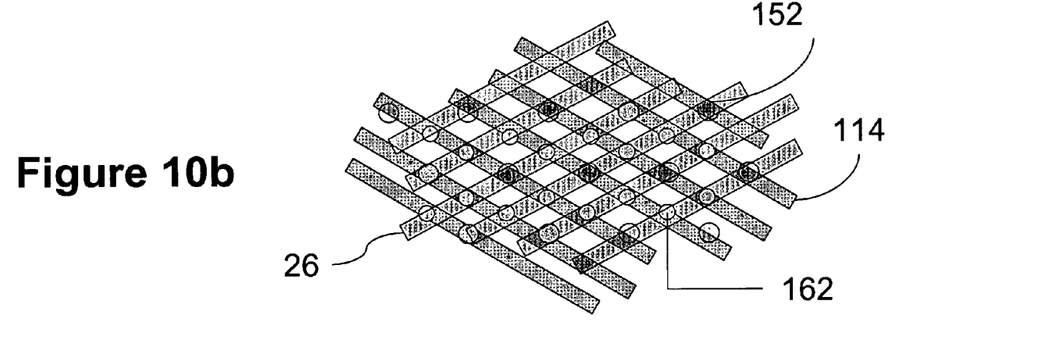
Figure 10C:
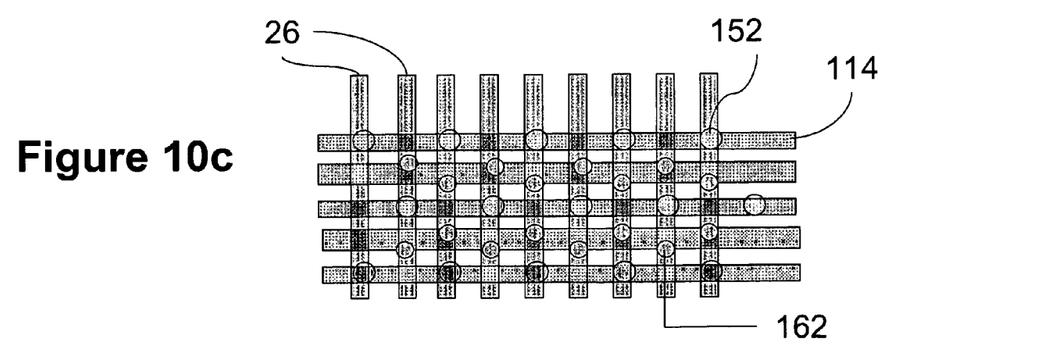

The first features 132 and filler features 142 may be either retained in the final device or removed after the formation of the pillar devices 112. For example, the conductive first features 132 and filler features 142 may be retained in contact with the upper part of the devices 112. The upper conductors or electrodes 26 shown in FIG. 1 are then formed in contact with the first features 132 and filler features 142. A cross-sectional view of same is shown in FIG. 10a. Alternatively, the first features 132 and filler features 142 may be removed prior to formation of the upper conductors or electrodes 26. The upper conductors or electrodes 26 may be formed by the subtractive or the Damascene processes described above with respect to FIG. 2 or 3. According to the first embodiment, shown in FIG. 10b, the upper electrodes 26 and the bottom electrodes 114 extend in directions which differ from each other by about 60 degrees (e.g., the upper and bottom electrodes are both diagonal). As shown in FIG. 10c, according to the second embodiment, the upper electrodes 26 extend perpendicular to the bottom electrodes 114.

Figure 11A:
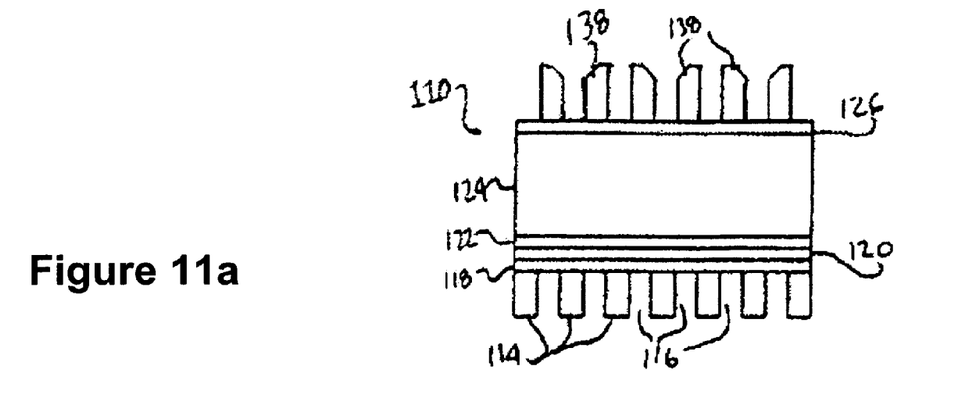
FIGS. 11a through 11c are cross-sectional side views illustrating steps in a process of an alternative embodiment.
Figure 11B:
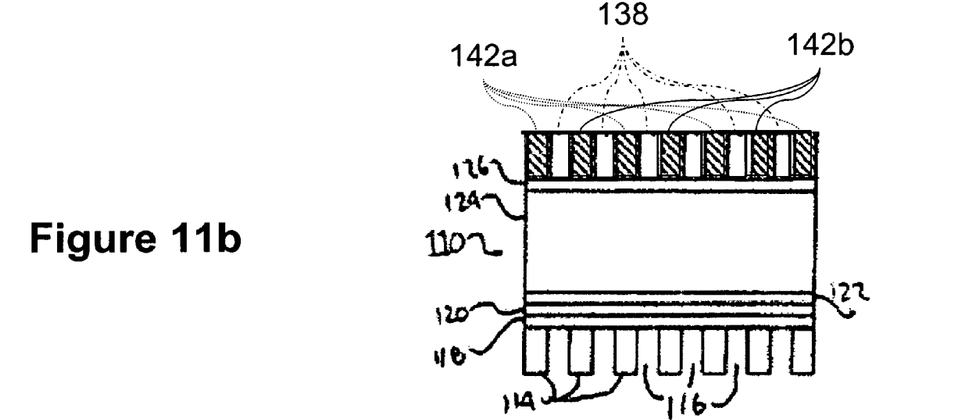
Figure 11C:
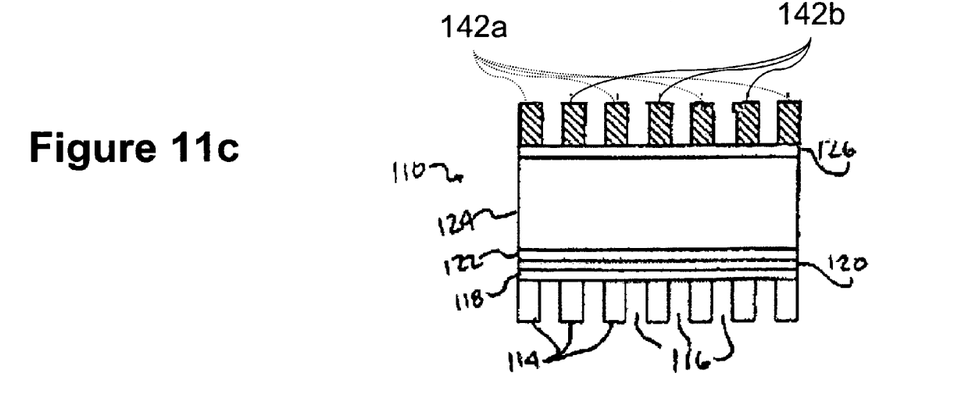

FIGS. 11a through 11c illustrate the steps in a process according to an alternative embodiment. This alternative embodiment comprises selectively removing the first features 132 after the step of forming sidewall spacers 138, and prior to the step of filling a space between the sidewall spacers with a plurality of filler features. The first features 132 are then removed by selective etching, leaving the spacers 138 spaced apart from one another, as shown in FIG. 11a. If the first features 132 are made of amorphous carbon, then ashing can be used to remove them.

FIGS. 11b and 11c show the next two steps of the process. A tungsten filler material film or layer is formed between the spacers 138, filling the space initially occupied by the first features 132 and the spaces 134. Alternatively, an insulating filler material film or layer, such as silicon oxide, silicon nitride, silicon oxynitride, amorphous carbon, which has different etch characteristics from the spacer material may be used instead. The tungsten filler film is then planarized by CMP or etchback to expose the upper surfaces of the spacers 138, resulting in a loss of about 200 to about 400 Å, such as about 300 Å to about 500 Å, of the tungsten filler film. The planarization leaves a plurality of tungsten filler features 142 between the spacers 138. The filler features 142 at this point of the process may be between about 1500 Å and about 1700 Å thick. The filler features 142 may comprise first filler features 142a having a first shape defined by the first features 132, and second filler features 142b having a second shape defined by the interstitial spaces 140 located between the sidewall spacers as shown in FIG. 6. If the first features 132 have a cylindrical shape, then the first filler features 142a that fill the spaces previously occupied by first features 132 also have a cylindrical shape, and the second filler features 142b filling the interstices 140 have a substantially triangular shape with rounded corners.

FIG. 11c shows the next step in the process. In this step, the spacers 138 are selectively etched away leaving the filler features 142a, 142b spaced apart. The spacers 138 may be selectively etched by any selective wet or dry etch which can selectively etch silicon oxide or nitride of spaces 138 over the tungsten material of filler features 142. For example, an HF isotropic wet etch may be used. The plurality of first and second filler features can then be used as a mask to etch the at least one device layer, using methods described above. This alternative method can be applied to both the first embodiment and the second embodiment that are described above.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of first features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

What is claimed is:

1. A method of making a device, comprising:
   forming at least one device layer over a substrate;
   forming a plurality of spaced apart first features over the device layer, wherein each three adjacent first features form an equilateral triangle;
   forming sidewall spacers on the first features;
   filling a space between the sidewall spacers with a plurality of filler features;
   selectively removing the sidewall spacers; and
   etching the at least one device layer using at least the plurality of filler features as a mask.

2. A method of claim 1, wherein:
   the step of selectively removing the sidewall spacers leaves the first features and the filler features spaced apart from each other; and
   the step of etching the at least one device layer comprises etching the at least one device layer using the first features and the filler features as a mask.

3. A method of claim 1, further comprising selectively removing the first features after the step of forming sidewall spacers and before the step of filling a space between the sidewall spacers with a plurality of filler features.

4. A method of claim 3, wherein:
the step of selectively removing the sidewall spacers leaves the plurality of filler features spaced apart from each other; and
the step of etching the at least one device layer comprises etching the at least one device layer using the plurality of filler features as a mask.

5. A method of claim 1, wherein the step of etching the at least one device layer forms a plurality of first pillars having a first shape and a plurality second pillars having a second shape same or different from the first shape.

6. A method of claim 1, further comprising:
forming a plurality of rail-shaped bottom electrodes underneath the device layer.

7. A method of claim 6, wherein:
each three adjacent first features are formed over three adjacent bottom electrodes; and
each first feature of the three adjacent first features is located over a different bottom electrode.

8. A method of claim 7, further comprising forming a plurality of rail-shaped upper electrodes over the etched device layer, wherein the upper electrodes and the bottom electrodes extend in directions which differ from each other by about 60 degrees.

9. A method of claim 7, wherein:
the step of etching the at least one device layer forms a pattern comprising first pillars and second pillars, wherein the first pillars have a circular cross section and the second pillars have a cross section of a triangle with rounded corners;
a unit of three pillars comprising one first pillar and two second pillars repeats along a same bottom electrode;
three adjacent first pillars form an equilateral triangle;
six second pillars surround each first pillar in a hexagonal configuration; and
three first pillars surround each second pillar in an equilateral triangle configuration.

10. A method of claim 6, wherein:
two of each three adjacent first features are formed over one first bottom electrode;
a third feature of said three adjacent first features is formed over a third bottom electrode such that a second bottom electrode is adjacent to and located between the first bottom electrode and the third bottom electrode.

11. A method of claim 10, further comprising forming a plurality of rail-shaped upper electrodes over the device layer, wherein the upper electrodes extend perpendicular to the bottom electrodes.

12. A method of claim 10, wherein:
the step of etching the at least one device layer forms a pattern comprising first pillars and second pillars, wherein the first pillars have a circular cross section and the second pillars have a cross section of a triangle with rounded corners;
the first pillars are located over first bottom electrodes with a first distance between each two adjacent first pillars;
the second pillars are located over second bottom electrodes with a second distance between each two adjacent second pillars such that the second distance is shorter than the first distance;
the three adjacent first pillars form an equilateral triangle;
six of the second pillars surround each first pillar in a hexagonal configuration; and
three of the first type pillars surround each second pillar in a equilateral triangle configuration.

13. A method of claim 1, wherein the sidewalls spacers on adjacent first features along at least two predetermined directions contact each other to form fully enclosed interstitial spaces located between the sidewall spacers, and the filler features fill the interstitial spaces.

14. A method of claim 1, wherein:
the device comprises a plurality of nonvolatile memory cells; and
each the nonvolatile memory cell comprises a pillar diode as a steering element and a storage element.

15. A method of claim 14, the nonvolatile memory cell type is selected from at least one of antifuse, fuse, diode and antifuse arranged in a series, polysilicon memory effect cell, metal oxide memory, switchable complex metal oxide, carbon nanotube memory, graphene or carbon switchable resistance material, phase change material memory, conductive bridge element, or switchable polymer memory.

16. A method of making a pillar shaped nonvolatile memory device array, comprising:
forming a plurality of bottom electrodes over a substrate;
forming at least one semiconductor device layer over the plurality of bottom electrodes;
forming a plurality of spaced apart first features over the at least one semiconductor device layer, wherein each three adjacent first features form an equilateral triangle;
forming sidewall spacers on the plurality of spaced apart first features;
forming a filler film over and between the plurality of spaced apart first features;
planarizing the filler film to expose upper portions of the plurality of spaced apart first features and upper portions of the sidewall spacers to leave a plurality of filler features located between the sidewall spacers;
selectively removing the sidewall spacers;
etching the at least one semiconductor device layer to form a plurality of pillar-shaped diode containing nonvolatile memory cells using at least the plurality of filler features as a mask; and
forming a plurality of upper electrodes contacting the plurality of nonvolatile memory cells.

17. A method of claim 16, wherein:
the step of selectively removing sidewall spacers leaves the first features and filler features spaced apart from each other; and
the step of etching the at least one semiconductor device layer comprises etching the at least one semiconductor device layer using the plurality of first features and the plurality of filler features as a mask.

18. A method of claim 16, further comprising selectively removing the first features after the step of forming sidewall spacers, and before the step of forming a filler film.

19. A method of claim 18, wherein:
the step of selectively removing the sidewall spacers leaves the plurality of filler features spaced apart from each other; and
the step of etching at least one semiconductor device layer comprises etching the at least one semiconductor device layer using the plurality of filler features as a mask.

20. A method of claim 16, wherein:
each three adjacent first features are formed over three adjacent bottom electrodes; and each first feature of the three adjacent first features is located over a different bottom electrode; and the upper electrodes and the bottom electrodes extend in directions which differ from each other by about 60 degrees.

21. A method of claim 16, wherein:

two of each three adjacent first features are formed over one first bottom electrode;

the third first feature of said three adjacent first features is formed over a third bottom electrode such that a second bottom electrode is adjacent to and located between the first bottom electrode and the third bottom electrode; and the upper electrodes extend perpendicular to the bottom electrodes.

* * * * *